(12) United States Patent
Sakurabayashi

(10) Patent No.: US 7,681,168 B2
(45) Date of Patent: Mar. 16, 2010

(54) SEMICONDUCTOR INTEGRATED DEVICE, METHOD OF DESIGNING SEMICONDUCTOR INTEGRATED DEVICE, DEVICE FOR DESIGNING THE SAME, AND PROGRAM

(75) Inventor: Taro Sakurabayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 162 days.

(21) Appl. No.: 11/290,533

(22) Filed: Dec. 1, 2005

(65) Prior Publication Data
US 2006/0123367 A1 Jun. 8, 2006

(30) Foreign Application Priority Data
Dec. 3, 2004 (JP) ............................. 2004-350946

(51) Int. Cl.
*G06F 17/50* (2006.01)
(52) U.S. Cl. .................... 716/12; 716/5; 716/13; 716/19
(58) Field of Classification Search ............ 716/13, 716/19–21, 12–14, 5
See application file for complete search history.

(56) References Cited

U.S. PATENT DOCUMENTS

| | | | | |
|---|---|---|---|---|
| 6,202,195 B1 * | 3/2001 | Tanaka et al. | | 716/13 |
| 6,230,302 B1 * | 5/2001 | Gabele et al. | | 716/6 |
| 7,127,694 B2 * | 10/2006 | Watanabe et al. | | 716/9 |
| 7,200,831 B2 * | 4/2007 | Kitabayashi | | 716/13 |
| 2002/0035719 A1 * | 3/2002 | Tanaka | | 716/11 |
| 2002/0170020 A1 * | 11/2002 | Darden et al. | | 716/2 |
| 2003/0018949 A1 * | 1/2003 | Yoshida | | 716/14 |
| 2005/0034095 A1 * | 2/2005 | Bansal | | 716/18 |
| 2005/0097490 A1 * | 5/2005 | Travis et al. | | 716/10 |
| 2006/0085769 A1 * | 4/2006 | Bergeron et al. | | 716/2 |
| 2006/0143586 A1 * | 6/2006 | Suaya et al. | | 716/13 |
| 2007/0028201 A1 * | 2/2007 | Mehrotra et al. | | 716/12 |

FOREIGN PATENT DOCUMENTS

JP 2002-183238 6/2002
JP 2003-31664 1/2003

* cited by examiner

*Primary Examiner*—Paul Dinh
*Assistant Examiner*—Nha T Nguyen
(74) *Attorney, Agent, or Firm*—Foley & Lardner LLP

(57) ABSTRACT

A semiconductor integrated device has a wire layout structure such that $SL1 \leq SL2 < SL3$ wherein a minimum wiring space in a location where both of neighboring wires are fine wires is $SL1$, a minimum wiring space in a location where at least one of neighboring wires is a wide wire and the neighboring wires are at an equal potential is $SL2$, and a minimum wiring space in a location where at least one of neighboring wires is a wide wire and the neighboring wires are at an unequal potential is $SL3$.

5 Claims, 9 Drawing Sheets

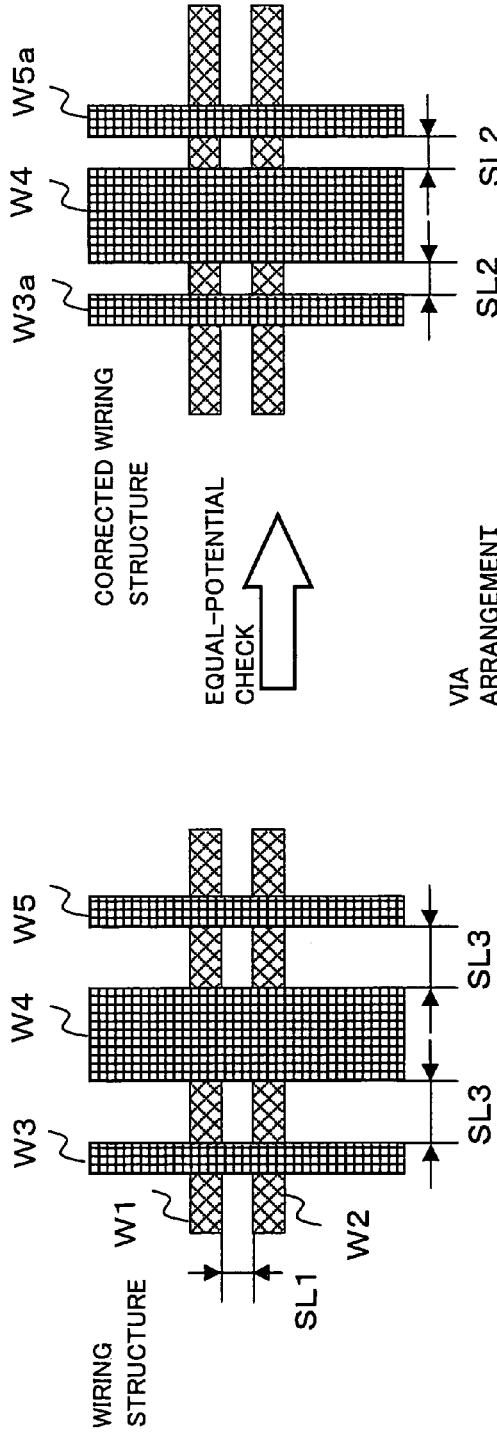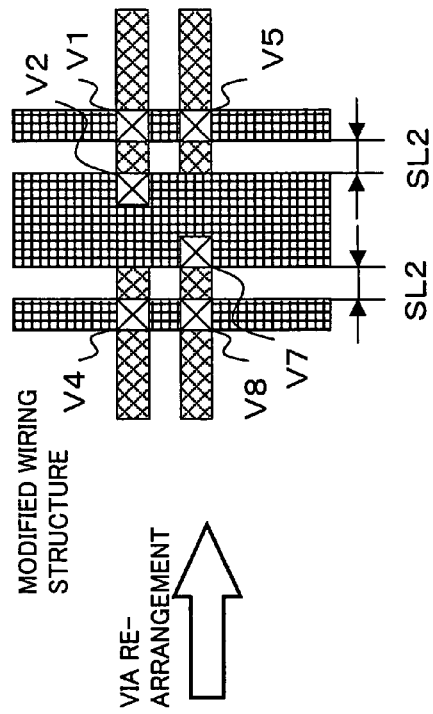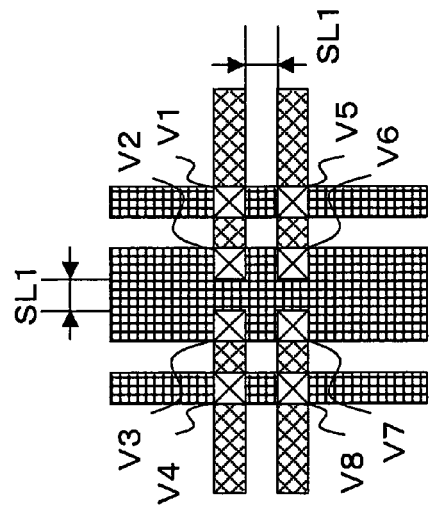

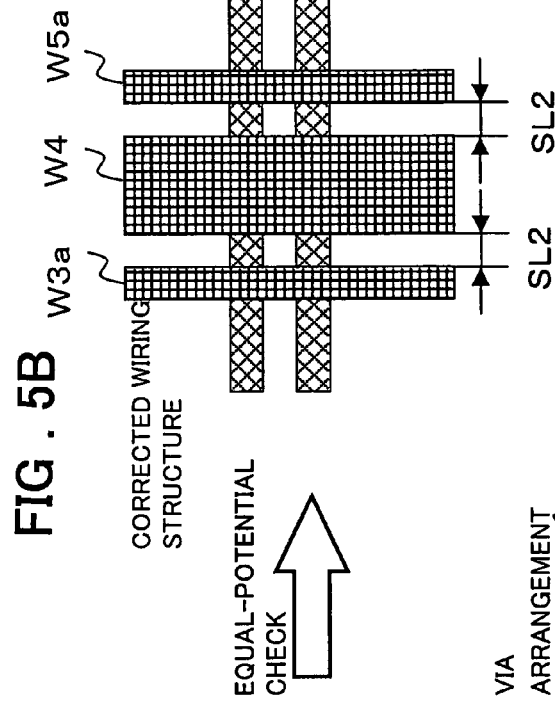
FIG. 5B
FIG. 5A
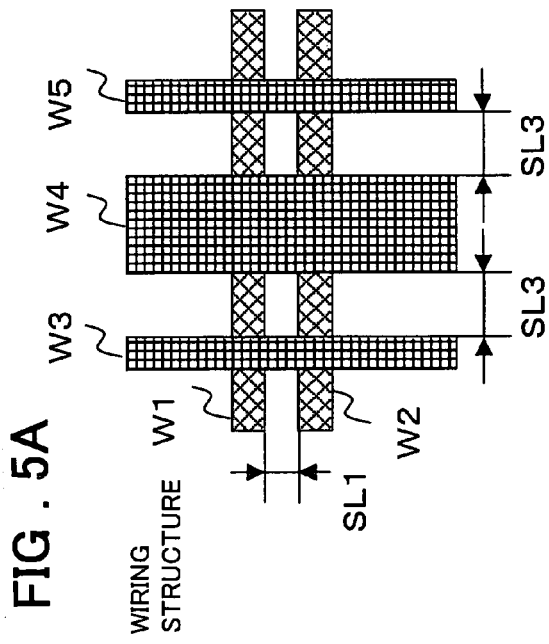
FIG. 5D
FIG. 5C
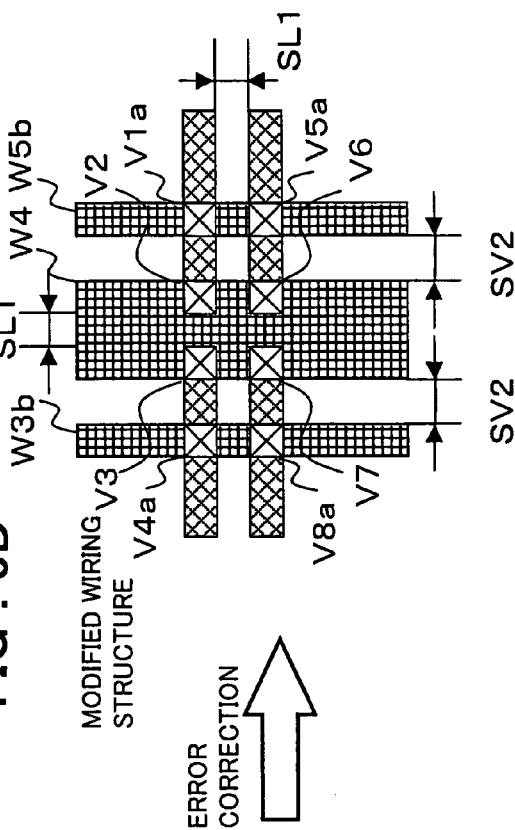
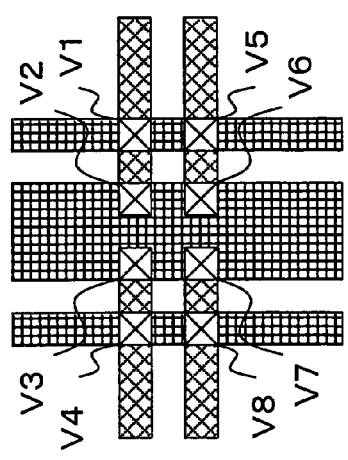

FIG. 7B
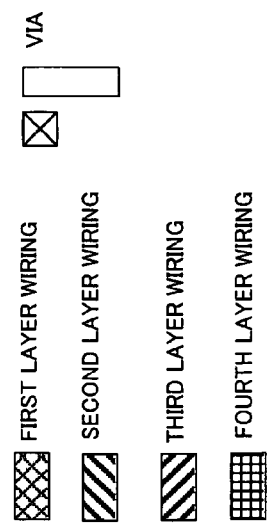
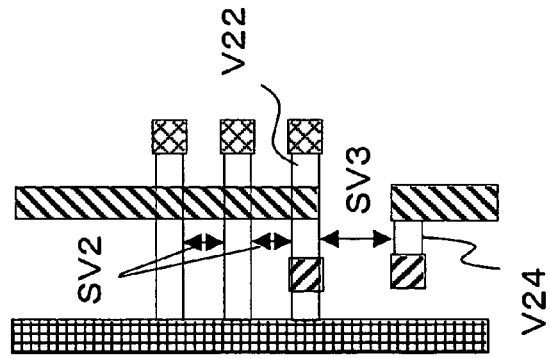
FIG. 7A
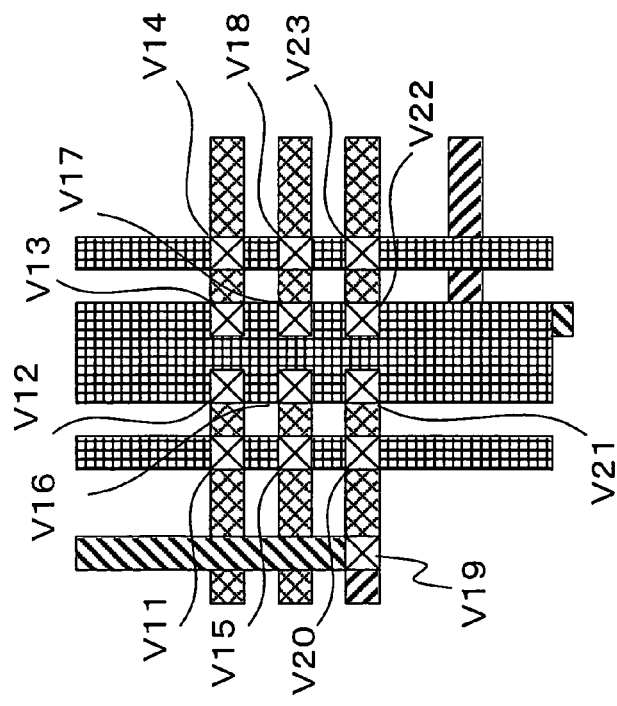
FIG. 7C
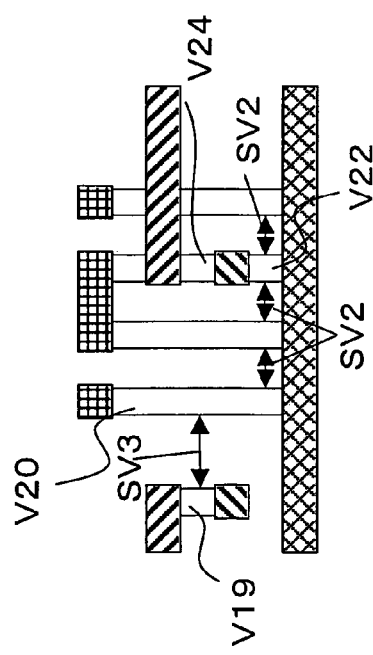

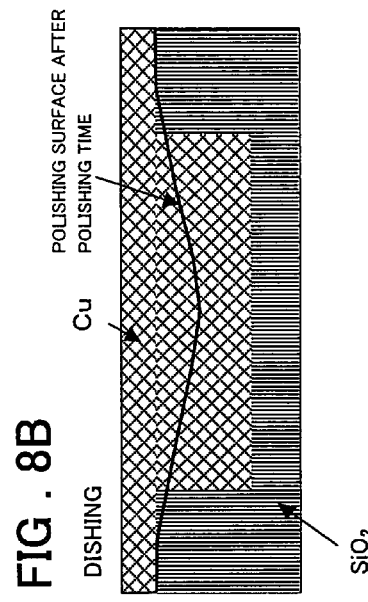
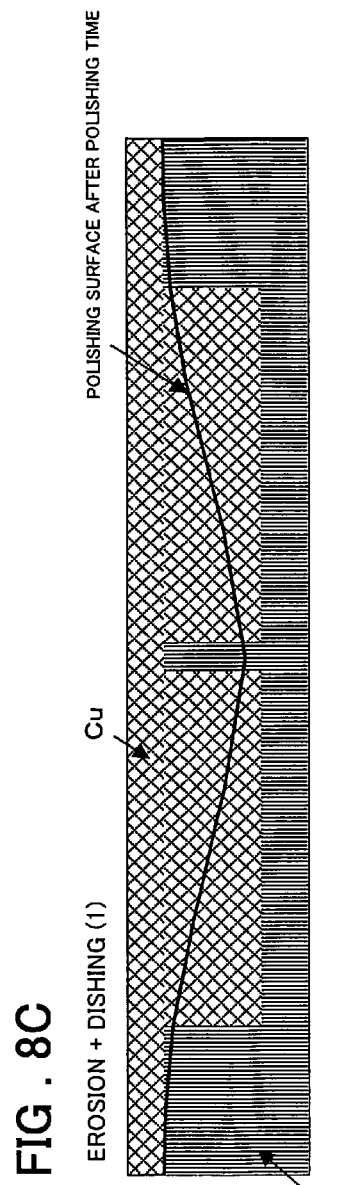
FIG. 8A EROSION
FIG. 8B DISHING
FIG. 8C EROSION + DISHING (1)
FIG. 8D EROSION + DISHING (2)

US 7,681,168 B2

SEMICONDUCTOR INTEGRATED DEVICE, METHOD OF DESIGNING SEMICONDUCTOR INTEGRATED DEVICE, DEVICE FOR DESIGNING THE SAME, AND PROGRAM

FIELD OF THE INVENTION

The present invention relates to a semiconductor integrated device, its design method, its design device, and its fabrication method, and a program, and more particularly to a semiconductor integrated device having wires of different widths, a design method for the wiring, a design device for the wiring, and a design program.

BACKGROUND OF THE INVENTION

A semiconductor integrated circuit is wired according to a predetermined wiring rule and, when multiple layers are wired, they are connected through vias (also called a through hole). In such wiring, a wire (called wide wire) wider than other signal wires (called fine wires) is usually used for the power wire and the ground wire to reduce the effect of a voltage drop. A wide wire is also used in many cases for a signal wire, such as a clock signal wire or other output signal wire where the driving power is required, to reduce a reduction in the signal level. In wiring such a wide wire, a space to the neighboring wires must be set wide.

One of the reasons is that a sufficient space (margin) to the neighboring wires is required to allow for a tolerance in the wire width of a wide wire. Another reason is a processing reason that occurs when a wiring pattern is formed on a semiconductor substrate because a wide pattern affects the other parts of the wiring pattern on a semiconductor substrate at exposure time during the fabrication of the semiconductor integrated circuit. Because a wider wire increases an exposure patterning error, the space is set wider. This is a well-known fact in designing and fabcticating a sub-micron semiconductor integrated circuit.

A still another reason is the dishing problem during Chemical Mechanical Polishing (CMP). Also related to a wide wire is fluid erosion (hydro-abrasion). As the wire becomes wider, the amount of dishing of the wiring metal part becomes larger at polishing time (i.e. after polishing) and, if the silicon oxide part that is a wiring space part is small, the amount of dishing becomes extremely large. This is a reason for increasing the space.

The following describes dishing and erosion with reference to FIG. 8. Because copper (Cu) is eroded by erosion more easily than silicon dioxide ($SiO_2$), the polishing surface at CMP time tends to be lowered as the ratio of the Cu area becomes higher as shown in FIG. 8A. Because copper (Cu) is eroded more easily than $SiO_2$, the polishing surface at CMP time tends to be lowered as the Cu area becomes larger and the amount of dishing becomes large as shown in FIG. 8B. In addition, because the surface is eroded by erosion when the wiring space of a wide wire is narrow, the $SiO_2$ part between the Cu parts is not almost resistant to the scraping by CMP as shown in FIG. 8C. In contrast, when the wiring space of a wide wire is expanded, the surface is slightly scraped by erosion as shown in FIG. 8(d) and, therefore, the intermediate $SiO_2$ part reduces the amount of scraping by CMP.

On the other hand, just as the space to a wide wire must be set wide when the above-described wiring pattern is formed, it is well known that, when vias for connecting different wiring layers are provided densely, the space between vias must be set wide. For vias, note that two-dimensional density has more influence than one-dimensional density. Thus, for two-dimensional density, a criterion different from that of wiring should be prepared for spacing.

When designing the arrangement of those vias, a connecting macro, where multiple vias are arranged at a space (interval) between each two vias according to the area of the intersection between anticipated wide wires, is provided for connection. For example, as shown in FIG. 9, a macro where 3×3 vias are arranged at intervals between them is used to connect the wide wires in the upper layer to the wide wires in the lower layer. In this example, the minimum spaces SV100 and SV101 in the x-axis and y-axis directions are set differently to prevent two-dimensional density.

A method for easily and reliably determining a location where vias are dense is disclosed, for example, in Patent Document 1. Patent Document 1 describes that the two-dimensional via density described above has more problems than the one-dimensional via density.

Patent Document 2 discloses a related technology. This document discloses a layout design method and a design program that allow the wiring space to be varied according to the potential difference between wires considering oozed copper caused by the electric field between copper wires.

[Patent Document 1] Japanese Patent Kokai Publication No. JP-P2002-183238A

[Patent Document 2] Japanese Patent Kokai Publication No. JP-P2003-31664A

SUMMARY OF THE DISCLOSURE

As the integration of a semiconductor integrated device becomes higher recently, more and more wide wires have become used not only for a power wire and a ground wire but also for a clock signal wire and an output signal wire. In this case, because a wide wire and the neighboring wires must be wired at a predetermined space in a conventional semiconductor integrated device, the integration level of a pattern in a semiconductor integrated device cannot be increased.

The inventor of the present invention has found that, there is no problem even if the wiring space between wide wires or the via-to-via space is reduced in an area at a high via density when the potential is equal between them, and, as a result, the integration of an LSI can be increased. In this case, when the potential is equal between wires or vias, there is no failure even if wires or vias are short-circuited. However, a layout in which wires or vias are completely short-circuited and integrated into a large pattern is not desirable to LSI fabrication because of a problem such as dishing. For this reason, it is considered that a layout in which the pattern density does not vary much from location to location is desirable. The present invention has been invented under the concept that the minimum wiring space to a wide wire at an equal-potential or the minimum space between the neighboring vias at an equal-potential in a via-dense area should be determined appropriately during the LSI production process and an easy redesigning should be achieved.

In the present invention, a predetermined wiring rule is defined for a semiconductor integrated device for which wiring is to be designed. A wire for which the narrowest space is set is called a fine wire, and a wire which requires a wide wiring space and therefore requires a wiring space wider than that of other wires is called a wide wire. A fine wire and a wide wire, which depend on the wiring layer and the wiring thickness, are determined for each layer. The area of a high via density (or via-dense area) refers to an area where, in a predetermined area for vias, the distance from one via to each of a predetermined number of (other) vias or more is shorter than a predetermined distance (for example, there are three or more neighboring vias at a distance shorter than an equal-potential via-to-via minimum space SV2) in the via-dense area.

In one aspect, the present invention provides a semiconductor integrated device having a plurality of wires. The semiconductor integrated device has a wire layout structure such that SL1≦SL2<SL3 where a minimum wiring space in a location where both of neighboring wires are fine wires is SL1, a minimum wiring space in a location where at least one of neighboring wires is a wide wire and the neighboring wires are at an equal potential is SL2, and a minimum wiring space in a location where at least one of neighboring wires is a wide wire and the neighboring wires are at an unequal potential is SL3.

In one aspect, the present invention provides a wiring method for laying out wiring of a semiconductor integrated device using a design device. The wiring method comprises the steps of wiring wires in a location, where both of neighboring wires are fine wires, at a minimum wiring space as SL1 and wiring wires in a location, where at least one of neighboring wires is a wide wire, at a minimum wiring space as SL3; making an equal-potential check for the wires in a location where at least one of neighboring wires is a wide wire; and if the neighboring wires are found to be at an equal potential as a result of the equal-potential check, rewiring the wires by narrowing the minimum wiring space from SL3 to SL2 (where SL1≦SL2<SL3).

In another aspect, the present invention provides a wiring method for laying out wiring of a semiconductor integrated device using a design device. The wiring method comprises the steps of wiring wires in a location, where both of neighboring wires are fine wires, at a minimum wiring space as SL1; wiring wires in a location where at least one of neighboring wires is a wide wire and the neighboring wires are at an equal potential, at a minimum space as SL2; and wiring wires in a location where the neighboring wires are at an unequal potential, at a minimum wiring space as SL3 (where SL1≦SL2<SL3).

In one aspect, the present invention provides a design device for laying out wiring of a semiconductor integrated device. The device comprises a storage unit in which wiring structure information and wiring potential information are stored; a wiring space correction unit for wiring wires in a location where both of neighboring wires are fine wires, with a minimum wiring space as SL1 and wiring wires in a location, where at least one of neighboring wires is a wide wire, at a minimum wiring space as SL3 based on the wiring structure information stored in the storage unit, for making an equal-potential check for the wires in the location where at least one of neighboring wires is a wide wire based on the wiring potential information and, if the neighboring wires are found to be at an equal potential as a result of the equal-potential check, for rewiring the wires by narrowing the minimum wiring space from SL3 to SL2 (where SL1≦SL2<SL3); and a corrected wiring structure information holding unit for storing the wiring result as corrected wiring structure information.

In another aspect, the present invention provides a design device for laying out wiring of a semiconductor integrated device. The device comprises a storage unit in which wiring structure information and wiring potential information are stored; a wiring space correction unit for wiring wires in a location where both of neighboring wires are fine wires, at a minimum wiring space as SL1, for wiring wires in a location where at least one of neighboring wires is a wide wire, at a minimum wiring space as SL2, and for wiring neighboring wires at an unequal potential at a minimum wiring space as SL3 (where SL1≦SL2<SL3) based on the wiring structure information stored in the storage unit; and a corrected wiring structure information holding unit for storing the wiring structure information.

In one aspect, the present invention provides a program for causing a computer that constitutes a design device for laying out wiring of a semiconductor integrated device to perform the following steps. The steps comprise: wiring wires in a location where both of neighboring wires are fine wires, at a minimum wiring space as SL1 and wire wires in a location where at least one of neighboring wires is a wide wire, at a minimum wiring space as SL3; making an equal-potential check for wires in a location where at least one of neighboring wires is a wide wire; and if the neighboring wires are found to be at an equal potential as a result of the equal-potential check, rewiring the wires by narrowing the minimum wiring space from SL3 to SL2 (where SL1≦SL2<SL3).

In another aspect, the present invention provides a program for causing a computer that constitutes a design device for laying out wiring of a semiconductor integrated device to perform the following steps. The steps comprise: wiring wires in a location where both of neighboring wires are fine wires, at a minimum wiring space as SL1, wire wires in a location where at least one of neighboring wires is a wide wire and the neighboring wires at an equal potential, at a minimum wiring space as SL2; and wiring wires in a location where the neighboring wires are at an unequal potential, at a minimum wiring space as SL3 (where SL1≦SL2<SL3).

The meritorious effects of the present invention are summarized as follows.

According to the present invention, the minimum wiring space to a wide wire is set narrower when a wire is at an equal potential with the wide wire than when the wire is at an unequal potential with the wide wire. Therefore, the integration of a pattern in a semiconductor integrated device can be increased.

BRIEF DESCRIPTION OF THE DRAWINGS

FIGS. 3A, 3B 3C and 3D are diagrams schematically showing a change in the wiring layout in the design stage in the first embodiment of the present invention.

FIGS. 5A, 5B, 5C and 5D are diagrams schematically showing a change in the wiring layout in the design stage in the second embodiment of the present invention.

FIGS. 7A, 7B and 7C are diagrams schematically showing an example of a wiring pattern according to the design of the present invention.

FIGS. 8A, 8B, 8C and 8D are diagrams schematically showing dishing in a wiring metal part that is generated according to a wiring space at polishing time.

PREFERRED EMBODIMENTS OF THE INVENTION

Figure 1:
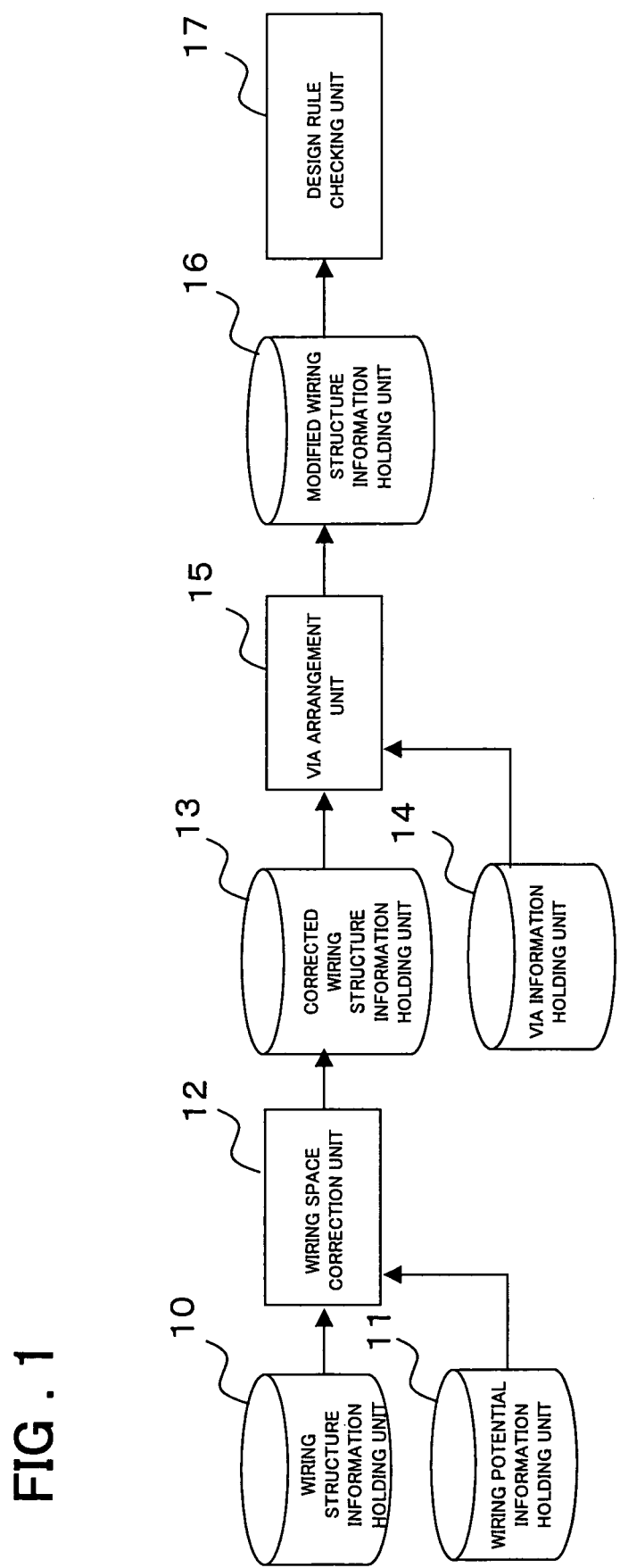
FIG. 1 is a block diagram showing the configuration of a design device of a semiconductor integrated device in an embodiment of the present invention.

FIG. 1 is a block diagram showing the configuration of a design device of a semiconductor integrated device in an embodiment of the present invention. Referring to FIG. 1, the design device comprises a wiring structure information holding unit 10, a wiring potential information holding unit 11, a wiring space correction unit 12, a corrected wiring structure information holding unit 13, a via information holding unit 14, a via arrangement unit 15, a modified wiring structure information holding unit 16, and a design rule checking unit 17. The wiring structure information holding unit 10 stores, in advance, information on the wiring structure of a semiconductor integrated device for which wiring is to be laid out. The wiring potential information holding unit 11 stores, in advance, potential information on the wiring of the semiconductor integrated device.

The wiring space correction unit 12 wires a fine wire (or wires) and a wide wire (or wires) based on the wiring structure information stored in the wiring structure information holding unit 10 so that the minimum wiring space of each wire is satisfied. In addition, the wiring space correction unit 12 performs an equal-potential check for a wiring location where at least one of the neighboring wires is a wide wire based on the wiring potential information stored in the wiring potential information holding unit 11. If the result of the equal-potential check indicates that the neighboring wires are at an equal potential, the wiring space correction unit 12 rewires the wiring by narrowing the minimum wiring space. The wiring space correction unit 12 stores the wiring result into the corrected wiring structure information holding unit 13 as corrected wiring structure information.

The via information holding unit 14 stores, in advance, information on the vias of the wiring structure of a semiconductor integrated device for which wiring is to be laid out. The via arrangement unit 15 reads the corrected wiring structure information from the corrected wiring structure information holding unit 13 and the via information from the via information holding unit 14, extracts an equal-potential intersection in the different wiring layers based on the corrected wiring structure information, and arranges a via (or wires) at the extracted equal-potential intersection (or intersections). For a wire that does not satisfy the via-dense criterion in a predetermined via-dense area based on the via information as a result of the wiring, the via arrangement unit 15 rewires the wire by expanding the wiring space so that the via density criterion is satisfied. The via arrangement unit 15 stores the wiring result into the modified wiring structure information holding unit 16 as the modified wiring structure information.

The design rule checking unit 17 verifies the modified wiring structure information, which is stored in the modified wiring structure information holding unit 16, to check if the information satisfies the design rule determined by the fabrication process.

The design device of a semiconductor integrated device configured as described above sets the minimum wiring space to SL1 in a location where both of the neighboring wires are fine wires, and sets the minimum wiring space to SL3 in a location where at least one of the neighboring wires is a wide wire. An equal-potential check is made for a wiring location where at least one of the neighboring wires is a wide wire. In addition, if it is found as a result of the equal-potential check that the neighboring wires are at an equal potential, the minimum wiring space SL3 is narrowed to SL2 (where SL1≦SL2<SL3) and the wires are rewired accordingly. In addition, if, after the rewiring in which the minimum wiring space is narrowed from SL3 to SL2, a via that connects the wires in different wiring layers does not satisfy the via density criterion in a predetermined via-dense area, the minimum wiring space SL2 is expanded and rewired to SL4 (where SL4>SL2). The via density criterion refers to a via space criterion, which is applied when vias are provided densely, to prevent the via density from becoming equal to or higher than a predetermined density.

The function of the design device of a semiconductor integrated device described above can also be implemented by causing a general-purpose computer system to execute a predetermined program.

The wiring information obtained by such a design device is used to lay out the wiring of, and fabricate, a semiconductor integrated device. In the fabricated semiconductor integrated device, the minimum wiring space of a wire to a wide wire is narrower when the potential of the wire is equal to that of the wide wire than the case where the potential of the wire is not equal to that of the wide wire. Also, the minimum space of a via to a neighboring via in a via-dense area is narrower when the potential of the via is equal to that of the neighboring via than the case where the potential of the via is not equal to that of the neighboring via. Therefore, this configuration increases the integration of a pattern in the semiconductor integrated device. This design device will be described more in details below with reference to embodiments.

First Embodiment

Figure 2:
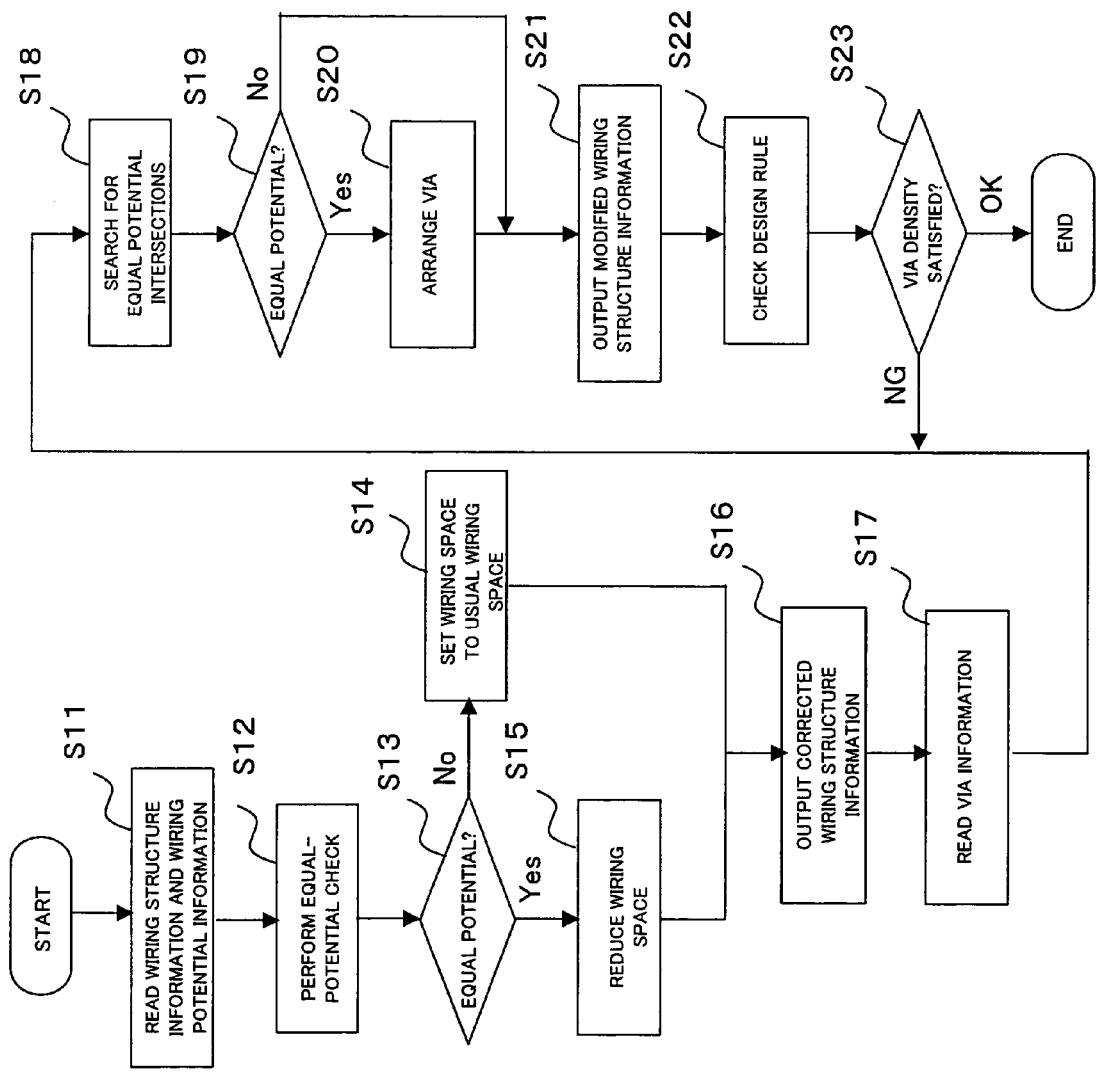
FIG. 2 is a flowchart showing the design method for a semiconductor integrated device in a first embodiment of the present invention.

FIG. 2 is a flowchart showing the design method of a semiconductor integrated device in a first embodiment of the present invention. The following primarily describes how an automatic wiring program wires a wide wire such as a power wire. A fine signal wire is wired after the processing in FIG. 2 is terminated.

In step S11 in FIG. 2, the program reads a file, which pre-stores therein the wiring structure information on a semiconductor integrated device for which wiring is to be laid out, from the wiring structure information holding unit 10. The wiring structure information file stores information on the wiring structure wired by a conventional automatic wiring program that does not consider whether the potential is equal between wires. Note that the wiring structure information file includes information on the structure where vias are not yet arranged. The program also reads potential information on the wires of the semiconductor integrated device from the wiring potential information holding unit 11 in which the potential information is stored in advance.

In step S12, the program makes an equal-potential check between neighboring wires to correct the space (interval) between the wires. This step is executed for a location where at least one of the neighboring wires is a wide wire. No wiring space correction is necessary for neighboring fine wires because the wiring structure information file already stores wiring structure data generated based on the fine wire minimum wiring space SL1.

If it is found in step S13 that the neighboring wires are at an equal potential as a result of the equal-potential check between the neighboring wires, control is passed to step S15. If the neighboring wires are not at an equal potential, control is passed to step S14.

In step S14, the wiring space is left set to the usual wide-wire wiring space, that is, to the unequal-potential wide wire minimum wiring space SL3, and control is passed to step S16.

In step S15, the wiring space is changed to the equal-potential wide wire minimum wiring space SL2. Note that the following relationship holds: fine wire minimum wiring space SL1≦equal-potential wide wire minimum wiring space SL2<unequal-potential wide wire minimum wiring space SL3.

In step S16, the wiring structure corrected for the wide wire is output to the corrected wiring structure information file.

In step S17, the program reads the via information file that includes information on the number of vias which connect the equal-potential intersections between power layers, and arrays (positional relation). For example, when the number of vias is four, information on the array format (1×4 or 2×2) and information on the via space are still necessary.

In step S18, for the wiring data stored in the corrected wiring structure information file, the program makes an equal-potential check in the intersections between power layers in order to search for a location or locations where vias are to be arranged for connection.

In step S19, control is passed to step S20 if the potentials are equal as a result of the equal-potential check in the intersections between power layers. If the potentials are not equal, control is passed to step S21.

In step S20, the vias are arranged according to the number of vias and the array (positional relation) specified in the via information file corresponding to the intersection size(s).

In step S21, the automatic wiring data to which information on the vias is added is output to the modified wiring structure information file.

In step S22, the DRC (Design Rule Check) program checks if the wiring satisfies the predetermined arrangement and wiring rule.

In step S23, the program checks whether the arranged vias satisfy the via density criterion. If the vias do not satisfy the criterion (NG), control is passed back to step S18 to rearrange the vias; if the vias satisfy the criterion (OK), a sequence of processing is terminated. Note that the via density criterion refers to a via space criterion which is applied when vias are created densely as described above. For example, if the number of vias adjacent to a specific via exceeds a predetermined number of vias, the via density criterion requires that the space SV2 longer than the minimum space SV1 be provided in order to avoid a via-dense area.

In the steps described above, the arrangement of equal potential vias is determined after the wiring of all equal potential wires is determined. Instead of this, it is also possible to determine the wiring of a part of equal potential wires and then to determine the arrangement of equal potential vias for the wired wires, and this sequence can be repeated for all wires to be laid out.

In the design method described above, the minimum space to a wide wire can be set shorter when the wires are at an equal potential than the case where the wires are at an unequal potential. This narrows the wiring space and increases the wiring density. In addition, the minimum space between vias can be set shorter when the vias in a via-dense area are at an equal potential than the case where the vias are at an unequal potential. This narrows the via-to-via space and increases the via density.

Next, the following describes an example of simple wiring layout according to the design method described above. FIG. 3 is a diagram schematically showing a change in the wiring layout in the design stage in the first embodiment of the present invention.

FIG. 3A is a diagram showing the wiring layout based on the information in the stage in step S11 in FIG. 2. The neighboring fine wires W1 and W2 are wired at the minimum wiring space SL1. The neighboring wide wires W3 and W4 are wired at the minimum wiring space SL3, and the neighboring wide wires W4 and W5 are wired at the minimum wiring space SL3.

If the wide wires W3, W4, and W5 are at an equal potential in the layout shown in FIG. 3A, the wires with the minimum wiring space SL3 are rewired narrowed to SL2 and the corrected wiring structure (wide wires W3a, W4, W5a) such as the one shown in FIG. 3B is obtained. The vias V1-V8 are arranged at the intersections where vias are necessary, and the layout such as the one shown in FIG. 3C is obtained.

Assume that, when the vias are arranged in the layout shown in FIG. 3C, the design rule check (DRC) detects an error of the via density criterion that is applied when the vias are arranged densely. Take the via V2 for example. Assume that the distance to the vias adjacent to the via V2 is as follows; the distance to the via V1 is SL2, the distance to the via V3 is SL1, and the distance to the via V6 is SL1, where SL1≦SL2<SV2. Also assume that the via density criterion is that an error is detected when there are three or more adjacent vias whose via density criterion does not satisfy the via-dense area equal-potential via-to-via minimum space SV2. In this case, a via density criterion error occurs for the via V2 because the distances to the three vias V1, V3, and V6 do not satisfy the via-dense equal-potential via-to-via minimum space SV2. Similarly, a via density criterion error occurs for the vias V3, V6, and V7.

In such a case, some vias, for example, the vias V3 and V6, are deleted (not arranged) to create the modified wiring structure layout such as the one shown in FIG. 3D. In the modified wiring structure layout, the number of adjacent vias, which do not satisfy the via-dense area equal-potential via-to-via minimum space SV2, is reduced to two or fewer and, therefore, the via density criterion is satisfied.

Because the space to an equal-potential wide wire is set to the minimum wiring space SL2 in the flowchart in FIG. 2, the via-to-via space in a via-dense area sometimes becomes SL2 when the wiring layers are connected. In this case, if the via-dense area equal-potential via-to-via minimum space SV2 satisfies the relation SL2<SV2, an error is detected by the design rule check (DRC).

In this case, it is possible to lay out the space to an equal-potential wide wire so that it is wider than the minimum wiring space SL2 and wider than the via-dense area equal-potential via-to-via minimum space SV2. However, if the space is set wider than the minimum wiring space SL2 of an equal-potential wide wire when there is no need for a via in a via-dense area, an over-margin condition occurs and the layout density cannot be increased. A design method for solving this problem will be described in a second embodiment.

Second Embodiment

Figure 4:
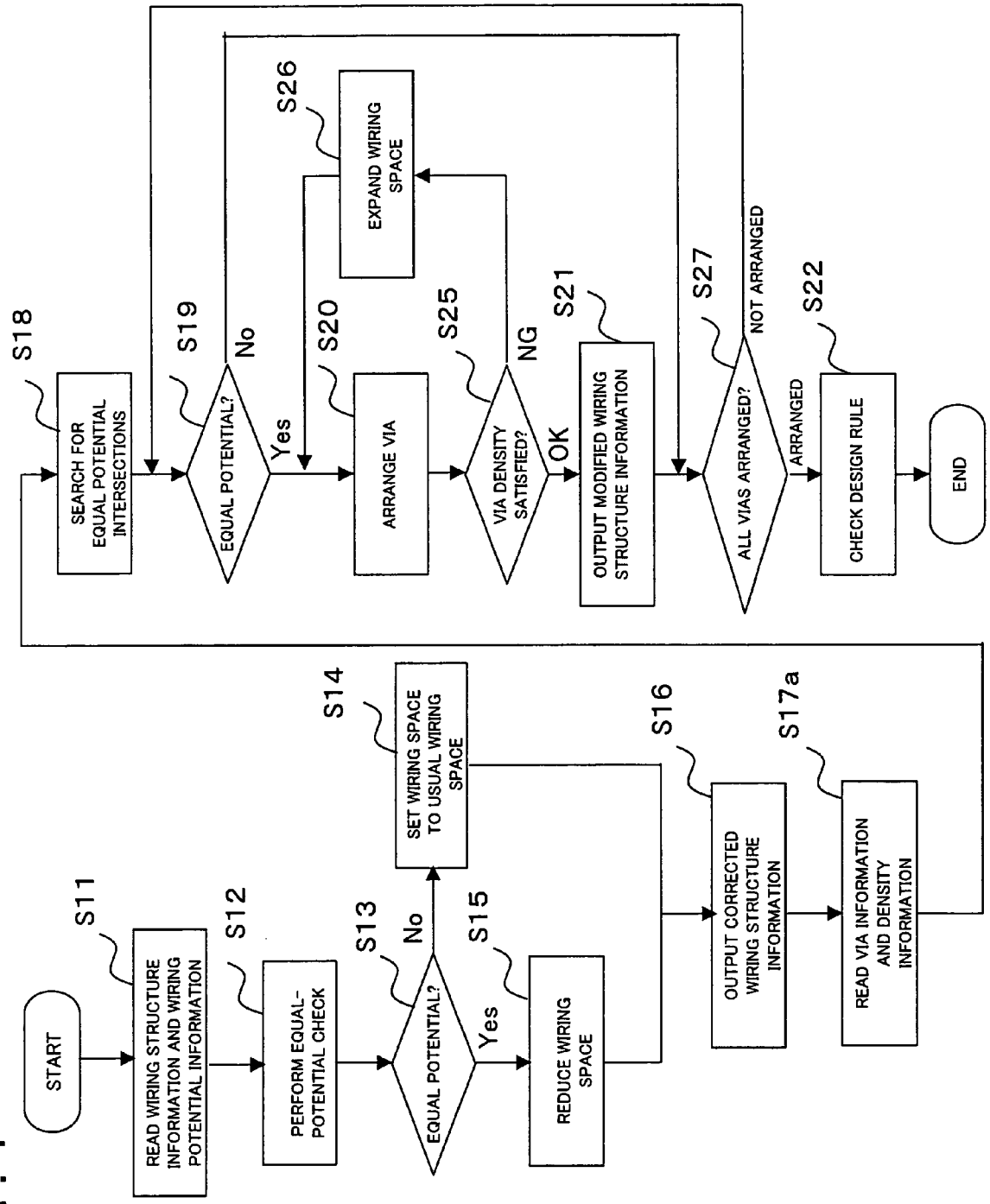
FIG. 4 is a flowchart showing the design method for a semiconductor integrated device in a second embodiment of the present invention.

FIG. 4 is a flowchart showing the design method for a semiconductor integrated device in a second embodiment of the present invention. In FIG. 4, the same processing is performed for the same reference numeral in FIG. 2 and repetitive description will not be given.

In step S17a in FIG. 4, the program reads information from the two files: one is the via information file that stores the number of vias, which connect the equal-potential intersections between power layers, and arrays, and the other is the via density information file that defines the via-dense areas.

In step S25, a determination is made as to whether the arranged via satisfies the via density criterion. If the via density criterion is satisfied (OK), control is passed to step S21; if the via density criterion is not satisfied (NG), control is passed to step S26.

In step S26, the wiring space is expanded to satisfy the via density criterion and control is passed to step S20 to confirm that the via density criterion is satisfied.

In step S27, whether or not all vias are arranged is checked. If all vias are not yet arranged, control is passed back to step S19; if all vias are arranged, control is passed to step S22.

Next, the following describes an example of a simple wiring layout according to the design method in the second embodiment described above. FIG. 5 is a diagram schematically showing a change in the wiring layout in the design stage in the second embodiment of the present invention. In FIG. 5, FIG. 5A, FIG. 5B, and FIG. 5C are almost the same as FIG. 3A, FIG. 3B, and FIG. 3C. However, the via arrangement differs in the following point. In FIG. 3C, all vias are first arranged and then the layout is changed as shown in FIG. 3D; on the other hand in FIG. 5C, each time one via is arranged, the layout is changed as shown in FIG. 5D and the via arrangement in FIG. 5C and FIG. 5D is performed repeatedly for all via arrangements.

If the via density criterion is not satisfied for the vias V2, V3, V6 and V7 when the vias are arranged in the layout in FIG. 5C, the wiring space is expanded for wiring. That is, as shown in FIG. 5D as compared to FIG. 5B, the space between the wide wires W3a and W4 and between the wide wires W4 and W5a is expanded from SL2 to SV2 (SV2>SL2) and the wide wires W3a and W5a are rewired as the wide wires W3b and W5b, respectively.

A via density criterion error can be avoided by modifying the wiring as described above when vias are densely arranged. Take the via V2 for example. Assume that the distance to the vias adjacent to the via V2 is as follows; the distance to the via V1a is SV2, the distance to the via V3 is SL1, and the distance to the via V6 is SL1. The via density criterion is that the number of adjacent vias that do not satisfy the via-dense area equal-potential via-to-via minimum space SV2 is two or fewer (vias V3 and V6) so as to satisfy the via density criterion.

When a via must be created in a via-dense area, the wiring space is expanded in the second embodiment as described above so that the via is laid out to satisfy the via-dense area equal-potential via-to-via minimum space. Therefore, there is no occurrence where the vias cannot be created so that vias can be created in such a via-dense area, and a design rule check error, which would be caused if the criterion for via arrangement is ignored, can be avoided.

Figure 6A:
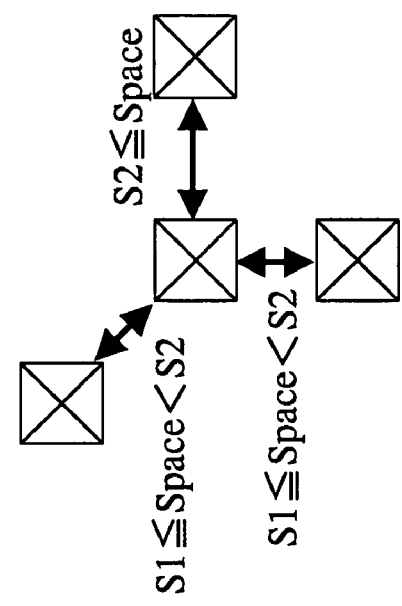
FIGS. 6A, 6B and 6C are diagrams showing an example of a method for determining if an area is a via-dense area.
Figure 6B:
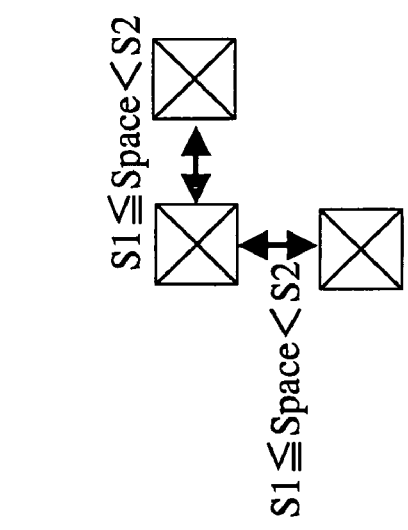
Figure 6C:
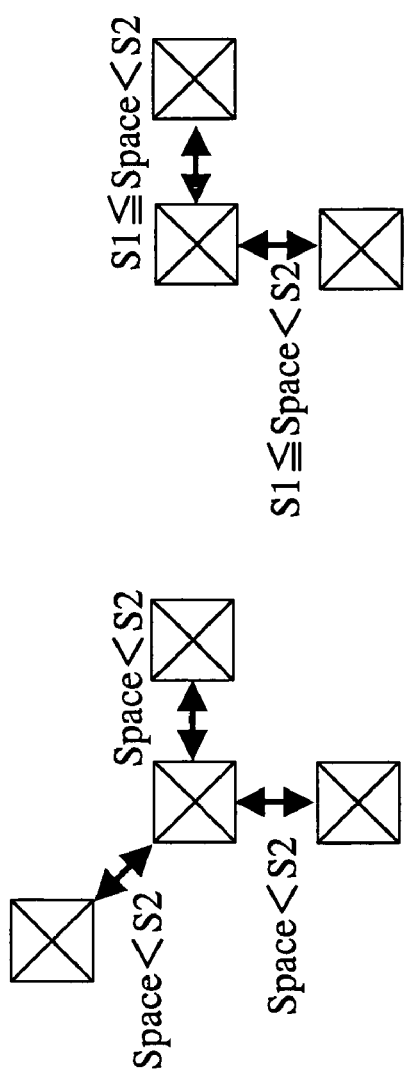
Figure 9:
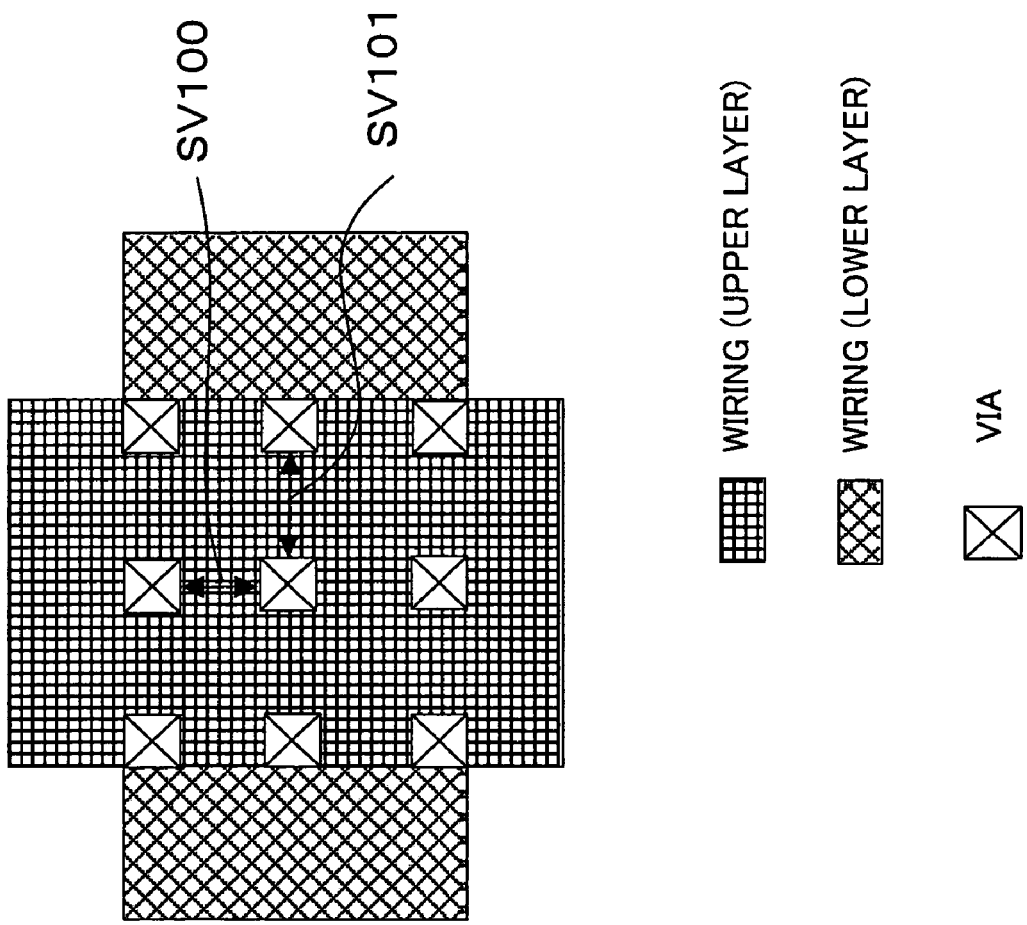
FIG. 9 is a diagram showing an example of a conventional via arrangement at the intersections of wide wires.

Next, the following describes an example of how to determine if an area is a via-dense area. FIG. 6 is a diagram showing an example of how to determine if an area is a via-dense area. Let S1 be the minimum via-to-via space, and let S2 be a space for determining if the area is a via-dense area. If the space between each two of three or more adjacent vias is shorter than S2 as shown in FIG. 6A, the automatic wiring program determines that the area is a via-dense area. If the space between each two of the two adjacent vias is S1 or longer but shorter than S2 as shown in FIG. 6B, the automatic wiring program determines that the area is not a via-dense area. In a via-dense area such as the one shown in FIG. 6A, one of the spaces among three adjacent vias is expanded to at least S2 or longer to lay out the vias as shown in FIG. 6C.

Conventionally, a macro in which vias are arranged as a matrix has been used to connect the power wires. In contrast, because the via-dense area determination method described above checks whether or not an area is a via-dense area to allow vias to be laid out freely, the vias can be better laid out.

In the embodiment described above, the minimum space between the neighboring vias in a via-dense area is shorter when the neighboring vias are at an equal potential than the case where the neighboring vias are at an unequal potential. This increases the integration of a pattern in a semiconductor integrated device.

Finally, the following describes an example of a wiring pattern. FIG. 7 is a diagram schematically showing an example of a wiring pattern designed according to the present invention. FIG. 7A is a front view of a semiconductor integrated device, FIG. 7B is a side view viewed from the right of the semiconductor integrated device, and FIG. 7C is a side view viewed from the bottom of the semiconductor integrated device. The vias V11-V18 and V20-V23, which are at an equal potential, are densely distributed vias with the space to a neighboring vias being SV2. Because the space to a neighboring via equals the via-dense area equal-potential via-to-via minimum space SV2, those vias satisfy the via density criterion. The via V19 (between the second wiring layer and the third wiring layer) and the via V20 (between the first wiring layer and the fourth wiring layer) are at an unequal potential, and the space between them is SV3 (SV3>SV2). In addition, the via V22 (between the first wiring layer and the fourth wiring layer) and the via V24 (between the second wiring layer and the third wiring layer) are at an unequal potential, and the space between them is SV3 (SV3>SV2). A semiconductor integrated device with such a wiring pattern can be created by the design method in the first embodiment and the second embodiment.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated device having a plurality of wires, comprising:

a minimum wiring space between a first plurality of wires disposed in a first wiring layer in a first location is defined as SL1, where each of the first plurality of wires disposed in the first location are fine wires and all wires in the first location are disposed at the first wiring layer, a minimum wiring space between a second plurality of wires disposed in a second wiring layer in a second location is defined as SL2, where at least one of the second plurality of wires disposed in the second location is a wide wire and neighboring wires with respect to the at least one of the second plurality of wires are at an equal voltage potential and all wires in the second location are disposed at the second wiring layer, and a minimum wiring space between a third plurality of wires disposed in a third wiring layer in a third location is defined as SL3, where at least one of the third plurality of wires disposed in the third location is a wide wire and all neighboring wires with respect to the at least one of the third plurality of wires are fine wires and are at an unequal voltage potential with respect to the wide wire in the third location and all wires in the third location are disposed at the third wiring layer, wherein said semiconductor integrated device has a wire layout structure such that SL1≦SL2<SL3.

2. The semiconductor integrated device as defined by claim 1 wherein, for a plurality of vias that connect wires between different wiring layers, a minimum space between vias in an area other than a via-dense area is SV1, a minimum space between vias at a substantially equal voltage potential with respect to each other in a via-dense area is SV2, and a minimum space between vias at a substantially unequal voltage potential with respect to each other in a via-dense area is SV3, wherein said semiconductor integrated device has a layout structure such that $SV1 \leqq SV2 < SV3$.

3. The semiconductor integrated device as defined by claim 1 wherein said wide wire includes a power wire.

4. A wiring method for laying out wiring of a semiconductor integrated device using a design device, said wiring method comprising the steps of:

wiring wires, by using a computer, at a minimum wiring space SL1 between a first plurality of wires disposed in a first wiring layer in a first location where each of the first plurality of wires disposed in the first location are fine wires and all wires in the first location are disposed at the first wiring layer;

wiring wires at a minimum wiring space SL2 between a second plurality of wires disposed in a second wiring layer in a second location where at least one of the second plurality of wires disposed in the second location is a wide wire and neighboring wires with respect to the at least one of the second plurality of wires are at an equal voltage potential and all wires in the second location are disposed at the second wiring layer; and wiring wires at a minimum wiring space SL3 between a third plurality of wires disposed in a third wiring layer in a third location where the neighboring at least one of the third plurality of wires disposed in the third location is a wide wire and is at an unequal voltage potential with respect to all neighboring wires of the third plurality of wires, the all neighboring wires of the third plurality of wires being fine wires and all wires in the third location are disposed at the third wiring layer, where $SL1 \leqq SL2 < SL3$.

5. A computer readable medium storing a computer program for causing a computer that constitutes a design device for laying out wiring of a semiconductor integrated device to perform the following steps comprising:

wiring wires at a minimum wiring space SL1 between a first plurality of wires disposed in a first wiring layer in a first location where each of the first plurality of wires disposed in the first location are fine wires and all wires in the first location are disposed at the first wiring layer;

wiring wires at a minimum wiring space SL2 between a second plurality of wires disposed in a second wiring layer in a second location where at least one of the second plurality of wires disposed in the second location is a wide wire and neighboring wires with respect to the at least one of the second plurality of wires are at an equal voltage potential and all wires in the second location are disposed at the second wiring layer; and wiring wires at a minimum wiring space SL3 between a third plurality of wires disposed in a third wiring layer in a third location where the neighboring at least one of the third plurality of wires disposed in the third location is a wide wire and is at an unequal voltage potential with respect to all neighboring wires of the third plurality of wires, the all neighboring wires of the third plurality of wires being fine wires and all wires in the third location are disposed at the third wiring layer, where $SL1 \leqq SL2 < SL3$.

* * * * *